US008917280B2

(12) United States Patent
Uchiyama

(10) Patent No.: US 8,917,280 B2
(45) Date of Patent: Dec. 23, 2014

(54) APPARATUS AND METHOD FOR CONTROLLING DISPLAY DEVICES

(75) Inventor: Yoshihiro Uchiyama, Chiba (JP)

(73) Assignee: Megachips Corporation, Osaka-shi (JP)

( * ) Notice: Subject to any disclaimer, the term of this patent is extended or adjusted under 35 U.S.C. 154(b) by 784 days.

(21) Appl. No.: 12/841,568

(22) Filed: Jul. 22, 2010

(65) Prior Publication Data

US 2011/0018887 A1 Jan. 27, 2011

(30) Foreign Application Priority Data

Jul. 23, 2009 (JP) ................................ 2009-172216

(51) Int. Cl.

| | |
|---|---|
| ***G09G 5/36*** | (2006.01) |
| ***H04N 7/00*** | (2011.01) |
| ***H03L 7/00*** | (2006.01) |
| ***G09G 5/00*** | (2006.01) |
| ***G09G 5/12*** | (2006.01) |
| ***G09G 5/18*** | (2006.01) |

(52) U.S. Cl.
CPC ................ *G09G 5/008* (2013.01); *G09G 5/006* (2013.01); *G09G 5/12* (2013.01); *G09G 5/18* (2013.01); *G09G 2360/18* (2013.01)
USPC ............................ 345/545; 348/478; 348/543

(58) Field of Classification Search
CPC ......... G09G 3/2022; G09G 5/00; G09G 5/36; G09G 5/10; H04N 2201/0471; G06F 3/038
USPC .............. 345/545, 3.2, 240.28; 348/500, 540, 348/464, 478, 476, 543, E5.018, E3.047
See application file for complete search history.

(56) References Cited

U.S. PATENT DOCUMENTS

| | | | | |
|---|---|---|---|---|
| 6,992,987 | B2 | 1/2006 | Kobayashi | |
| 7,034,812 | B2 * | 4/2006 | Chen et al. | 345/204 |
| 2003/0184532 | A1 | 10/2003 | Chen et al. | |
| 2005/0012706 | A1 | 1/2005 | Murade | |
| 2005/0078126 | A1 * | 4/2005 | Park et al. | 345/665 |

(Continued)

FOREIGN PATENT DOCUMENTS

| | | | |
|---|---|---|---|
| JP | 2004-110000 | A | 4/2004 |
| JP | 2005-3988 | A | 1/2005 |

(Continued)

OTHER PUBLICATIONS

Combined Chinese Office Action and Search Report issued Dec. 31, 2013 in Patent Application No. 201010237311.1 with English Translation.
Office Action issued on Aug. 4, 2014 in Chinese Patent Application No. 201010237311.1, along with its English translation.

*Primary Examiner* — Ryan R Yang
*Assistant Examiner* — Michael Le
(74) *Attorney, Agent, or Firm* — Oblon, Spivak, McClelland, Maier & Neustadt, L.L.P.

(57) ABSTRACT

An exemplary apparatus for controlling display devices writes pixel data in a buffer in synchronous with an input clock signal. A differential value that represents a change of timing difference between input and output sides is calculated in each of a plurality of frames, and a timing correction based on the differential value calculated during the previous frame is performed within the vertical blanking period. Thereafter, the pixel data is read and output from the buffer to the display device in synchronous with an output clock signal.

16 Claims, 8 Drawing Sheets

(56) References Cited

U.S. PATENT DOCUMENTS

| | | | |
|---|---|---|---|
| 2005/0162368 | A1 | 7/2005 | Yoshida et al. |
| 2006/0007208 | A1 | 1/2006 | Aoki |
| 2006/0098769 | A1 | 5/2006 | Na |

FOREIGN PATENT DOCUMENTS

| | | | |
|---|---|---|---|
| JP | 2005-148557 | A | 6/2005 |
| JP | 2006-11304 | A | 1/2006 |
| KR | 10-0564639 | B1 | 3/2006 |

* cited by examiner

APPARATUS AND METHOD FOR CONTROLLING DISPLAY DEVICES

This application claims benefit of Japanese Patent Application No. JP-A-2009-172216. The disclosure of the prior application is hereby incorporated by reference herein in its entirety.

BACKGROUND

This invention relates to display control apparatuses and methods for controlling display devices. The apparatuses receive image data, which is transmitted from an image source, in synchronous with input clock signal and output the image data to display devices in synchronous with output clock signal, which may be asynchronous with the input clock signal.

Image sources such as personal computers and various visual apparatuses may be connected to image display devices such as liquid crystal displays via digital image input/output interfaces based on various standards such as DisplayPort. The image source transmits packets that include image data, audio data, synchronizing signals, and the like, to the image display device.

In DisplayPort standard described above, image data is transmitted in synchronous with an input clock signal CLK1. Further, values M and N (each of M and N is a positive integer) are transmitted in order to enable the image display apparatus to generate an output clock signal CLK2, which has a relationship that N*(a cycle period of CLK1)=M*(a cycle period of CLK2). The values M and N are transmitted periodically to the image display apparatus so that the relationship between the clock signals CLK1 and CLK2 are updated periodically.

Accordingly, an image display devices may be accompanied with a display control apparatus including a clock generation circuit that generates the output clock signal CLK2 based on the input clock signal CLK1 and the values M and N received from the image source. The display control apparatus may further include circuitry to convert the image signal received in synchronous with the input clock signal CLK1 into an output signal to be supplied to the image display device in synchronous with the output clock signal CLK2.

U.S. Pat. No. 6,992,987 (Patent Document 1) discloses to recover clock signal CLK2 from clock signal CLK1 and the values M and N. Specifically, Patent Document 1 discloses to recover pixel and audio clock signals from a link clock signal by expressing the pixel and audio clock rates and the link clock rates using four parameters A, B, C, and D based on a master clock signal of 23.76 GHz, which is represented by $2^{10}\times3^{3}\times5^{7}\times11^{1}$ Hz.

As explained above, the cycle period of the output clock signal CLK2 is N/M times the cycle period of the input clock signal. However, there may be cases that the values M and N cannot be accurately expressed within an available number of bits. Thus, approximate values of M and N are transmitted. Further, when the input clock signal, which is used as a transmission clock, is spectrum spread, it is impossible to accurately determine the values of M and N. Thus, average values M and N may be transmitted.

When the output clock signal is generated based on such approximate or average values of M and N, the output clock becomes asynchronous with the input clock signal. That is, for example, a period of a frame measured based on the cycle period of the input clock signal may become different from a period of the frame measured based on the cycle period of the output clock signal. As a result, timings of edges of the input and output clock signals at the beginning of each frame becomes different with each other, and the amount of difference between the timings changes from a frame to another frame.

This change may be accumulated during successive frames and may generate an excessively large timing difference. As a result, the capacity of a buffer memory that absorbs the difference between the input and output timings of the image data may become insufficient, and the displayed image may be disturbed or it becomes impossible to display the image.

It is also possible to detect an edge of the output clock signal at the timing of a signal synchronized with the input clock signal, and determine a start timing of each of the lines of the output image. In this case, the difference, or the latency, between the input and output timings of the image data do not accumulate. However, the number of cycles of the output clock signal per line may change from a line to another line. If the number of cycles of pixel clock per line changes, the displayed image may be disturbed.

SUMMARY

An exemplary object of this disclosure is to provide display control apparatuses and methods for controlling display devices that can prevent accumulation of the difference, or the latency, between the input and output timings of the image data, without changing the number of cycles of the pixel clock signal per line.

Aspects of this disclosure can provide apparatuses for controlling display devices and methods for controlling display devices that can prevent accumulation of the difference, or the latency, between the input and output timings of the image data, without changing the number of cycles of the pixel clock signal per line.

An aspect of this disclosure can provide an apparatus for controlling display devices that includes an image data buffer including a buffer memory, a differential value calculation circuit, and a read control circuit. The image data buffer can receive input data including a plurality of groups of pixel data each representing values of a group of pixels that constitutes each of a plurality of lines that, in turn, constitutes each of a plurality of frames, in an order of the frames and further in an order of the lines in each of the frames, and can write the groups of pixel data in the buffer memory in synchronous with a first clock signal. The input data can further include end of horizontal blanking signals that indicate ends of horizontal blanking periods in respective ones of the lines such that each of the groups of pixel data is received after the end of horizontal blanking signal in corresponding one of the lines.

The differential value calculation circuit can calculate, in each of the plurality of frames, a differential value between a number of cycles of a second clock signal during a period of a specified number of cycles of the first clock signal and an expected value thereof. The read control circuit can assign, in a first one of the frames, a period of a specified number of cycles of the second clock signal for each of the lines from a read start timing determined based on a timing of the end of horizontal blanking signal in a first one of the lines in the order of the lines. The read control circuit can further perform, in each of a second and following ones of the frames, a timing correction before the end of horizontal blanking signal in the first one of the lines based on the differential value that the differential value calculation circuit calculated in a previous frame, and can subsequently assign a period of the specified number of cycles of the second clock signal for each of the lines from a corrected read start timing in the order of the lines. Further, the read control circuit can command, in each of the first and following ones of the frames, the buffer memory to read and output to the display device, in each of the assigned periods, corresponding one of the groups of pixel data in synchronous with the second clock signal. The second clock signal can be asynchronous with the first clock signal.

According to an aspect of this disclosure, the read control circuit can include a clock counter that is initialized to an initial value at the timing of the end of horizontal blanking signal in the first one of the lines in the first one of the frames and then repeats counting cycles of the second clock signal and being initialized to the initial value when a count value of the clock counter reaches a specified count value. The read control circuit can assign the period of the specified number of cycles of the second clock signal for each of the lines based on the count value of the clock counter, and can perform the timing correction by adjusting one of the specified count value and the initial value.

In an embodiment, the differential value calculation circuit can calculate the differential value based on the count value of the clock counter at a timing of the end of horizontal blanking signal in one of the lines after the first one of the lines. In another embodiment, the read control circuit can command the buffer memory to read and output the corresponding one of the groups of pixel data when the count value of the clock counter is within a specified range.

An aspect of this disclosure can provide an apparatus for controlling display devices that includes an image data buffer including a buffer memory, a read control circuit including a clock counter, and a differential value calculation circuit. The counter can be initialized to an initial value at a timing of the end of horizontal blanking signal in a first one of the lines in a first one of the frames and can repeat counting cycles of a second clock signal and being initialized to the initial value when the count value of the clock counter reaches a specified count values.

The differential value calculation circuit can calculate, in each of the plurality of frames, a differential value between the count value of the clock counter at a timing of the end of horizontal blanking signal in one of the lines after the first one of the lines and an expected value thereof. The read control circuit can assign, in the first one of the frames, a period of a specified number of cycles of the second clock signal for each of the lines based on the count value of the clock counter in the order of the lines. The read control circuit can further perform, in each of a second and following ones of the frames, a timing correction before the end of horizontal blanking signal in the first one of the lines by adjusting one of the specified count value and the initial value based on the differential value that the differential value calculation circuit calculated in a previous frame, and can subsequently assign a period of the specified number of cycles of the second clock signal for each of the lines based on the count value of the clock counter in the order of the lines. Further, the read control circuit can command, in each of the first and following ones of the frames, the buffer memory to read and output to the display device, in each of the assigned periods, corresponding one of the groups of pixel data in synchronous with the second clock signal.

An aspect of this disclosure can provide a method for controlling display devices that includes receiving input data including a plurality of groups of pixel data, and writing the groups of pixel data in a buffer memory in synchronous with a first clock signal. The method can further include calculating, in each of the plurality of frames, a differential value between a number of cycles of a second clock signal during a period of a specified number of cycles of the first clock signal and an expected value thereof; assigning, in a first one of the frames, a period of a specified number of cycles of the second clock signal for each of the lines from a read start timing determined based on a timing of the end of horizontal blanking signal in a first one of the lines in the order of the lines; performing, in each of a second and following ones of the frames, a timing correction before the end of horizontal blanking signal in the first one of the lines based on the differential value calculated in a previous frame, and subsequently assigning a period of the specified number of cycles of the second clock signal for each of the lines from a corrected read start timing in the order of the lines; and commanding, in each of the first and following ones of the frames, the buffer memory to read and output to the display device, in each of the assigned periods, corresponding one of the groups of pixel data in synchronous with the second clock signal.

BRIEF DESCRIPTION OF THE DRAWINGS

Various exemplary embodiments of this disclosure will be described in detail with reference to the following figures, wherein like numerals reference like elements, and wherein.

DETAILED DESCRIPTION OF EMBODIMENTS

Firstly, the timing difference between the input and the output sides will be further explained.

Figure 6:
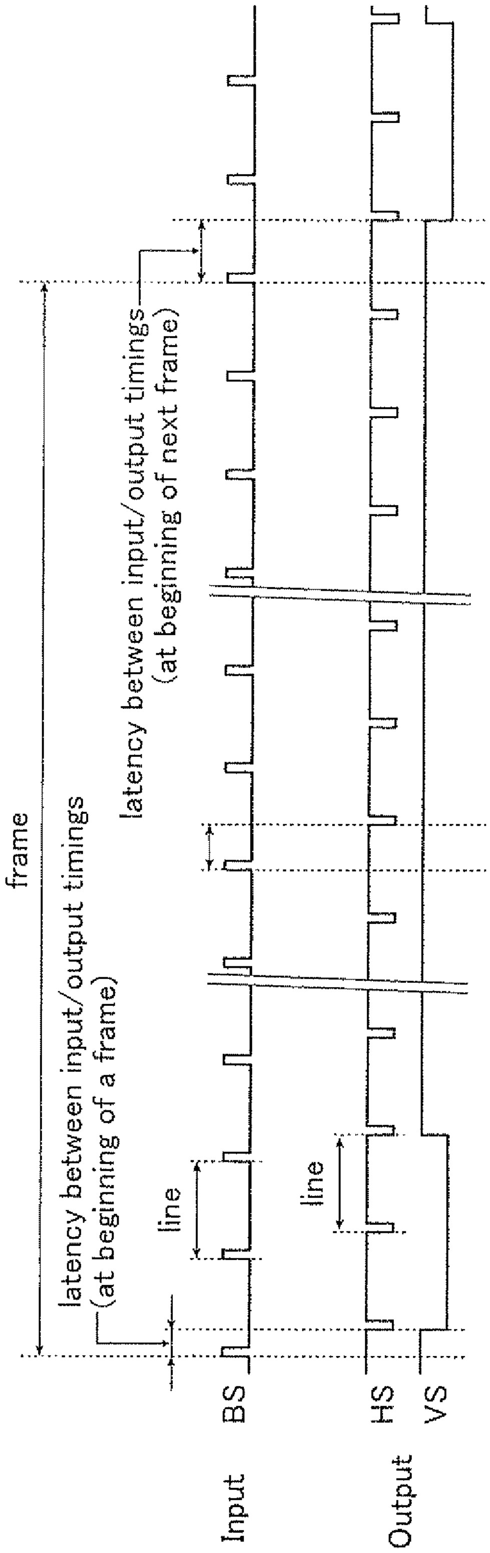
FIG. 6 Related Art
FIG. 6 is a timing chart that shows a change of the timing difference between start of horizontal blanking signal BS and horizontal synchronizing signal HS, which is synchronized with the output clock signal.

FIG. 6 is a timing chart that shows timing differences between start of horizontal blanking signals BS, which indicate timings of input image data, and vertical synchronizing signals VS and horizontal synchronizing signals HS, which indicate timings of output image data. The BS signal is synchronized with the input clock signal, while the VS and HS signals are synchronized with the output clock signal. The VS signal indicates the start of each frame of the output image data, and the HS signal indicates the start of each line of the output image data.

In FIG. 6, a period of a line of the input image, or an interval between successive BS signals, is determined by the cycle period of the input clock signal. While, a period of a line of the input image, or an interval between successive HS signals, is determined by the cycle period of the output clock signal. That is, the period of a line of the input image is determined by a period of a first specified number of cycles of the input clock signal, while the period of a line of the output image is determined by a period of a second specified number, which is different from the first specified number, of cycles of the output clock signal.

In the example shown in FIG. 6, the period of a line of the output image is longer than the period of a line of the input image. Accordingly, the difference between the timings, or latency, of the BS signal and the HS signal at the beginning of a frame, i.e., at the timing of a falling edge of the VS signal, increases compared with the latency at the beginning of the previous frame. On the other hand, when the period of a line of the output image is shorter than the period of a line of the input image, the direction of the change of the timing difference is the opposite.

In either case, the difference, or the latency, between the timings of the BS signal and the HS signal, i.e., the difference, or the latency, between the input and output timings of the image data, changes. This change may be accumulated during successive frames and may generate an excessively large timing difference.

Figure 7:
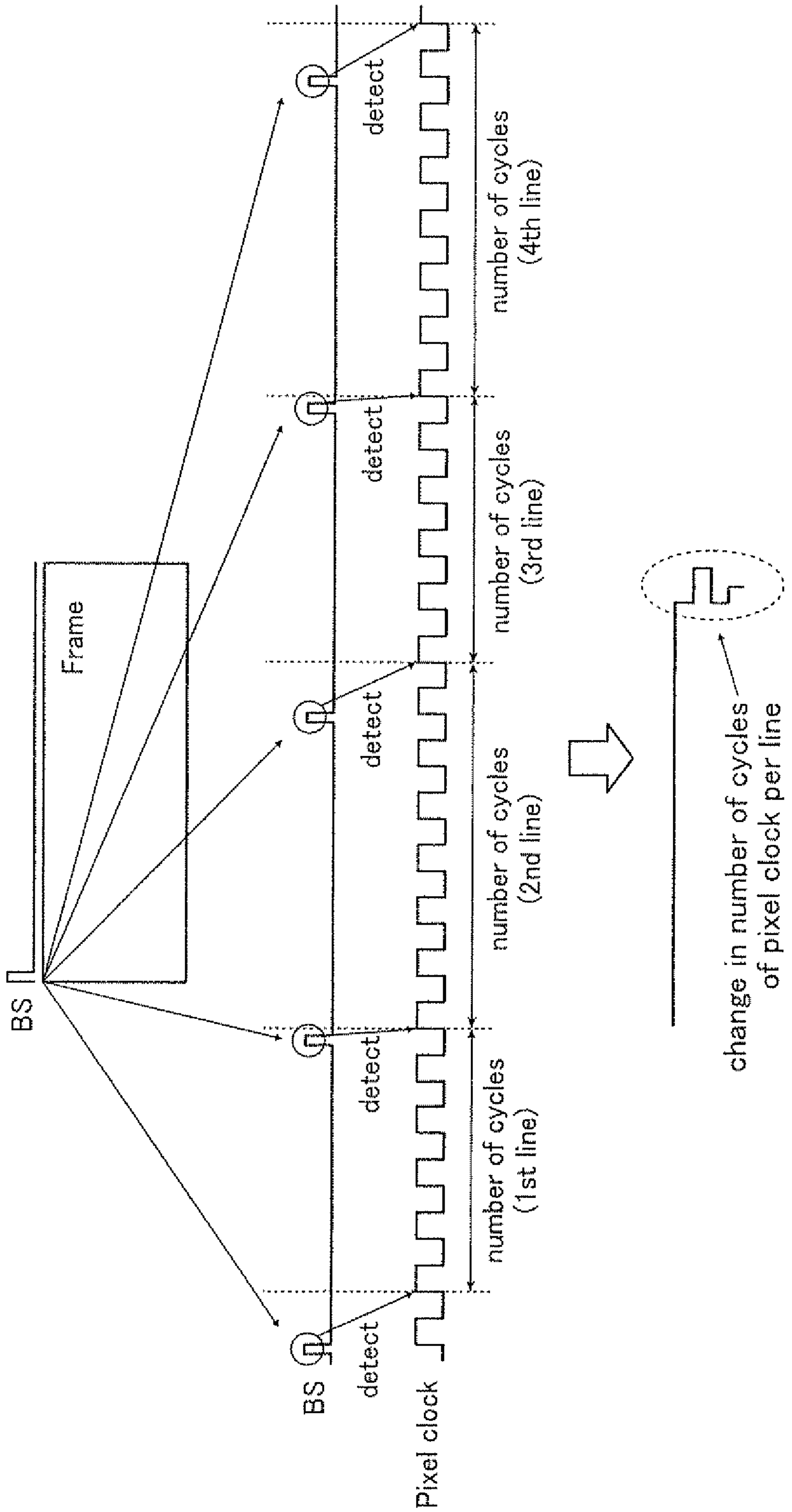
FIG. 7 Related Art
FIG. 7 is a schematic drawing that shows a change in number of cycles of the pixel clock signal per line.

FIG. 6 shows an example that the periods of each line of the input and output image are determined by respective specified numbers of cycles of the input and output clock signals. It is also possible to detect an edge of the output clock signal at the timing of the BS signal, which is synchronized with the input clock signal, and determine a start timing of each of the lines of the output image, as show in FIG. 7. Specifically, in FIG. 7, it is assumed that a line of the output image starts from the first rising edge of the output clock signal, or the pixel clock signal, detected after a lapse of a certain set-up time from the detection of the BS signal.

In this case, the difference, or the latency, between the input and output timings of the image data do not accumulate. However, the number of cycles of the output clock signal per line may change from a line to another line.

Specifically, because the input clock signal and the output clock signal are asynchronous with each other, timings of the edges of the output clock signal do not align with the signal BS, which is generated in synchronous with the input clock signal. Further, depending on the ratio MIN and the number of cycles of the input clock signal between successive BS signals, the relationship between the timings of the BS signal and the output clock signal may change from a line to another. Accordingly, as shown on the lower side of FIG. 7, number of cycles of the pixel clock per line may change from a line to another line.

Figure 8:
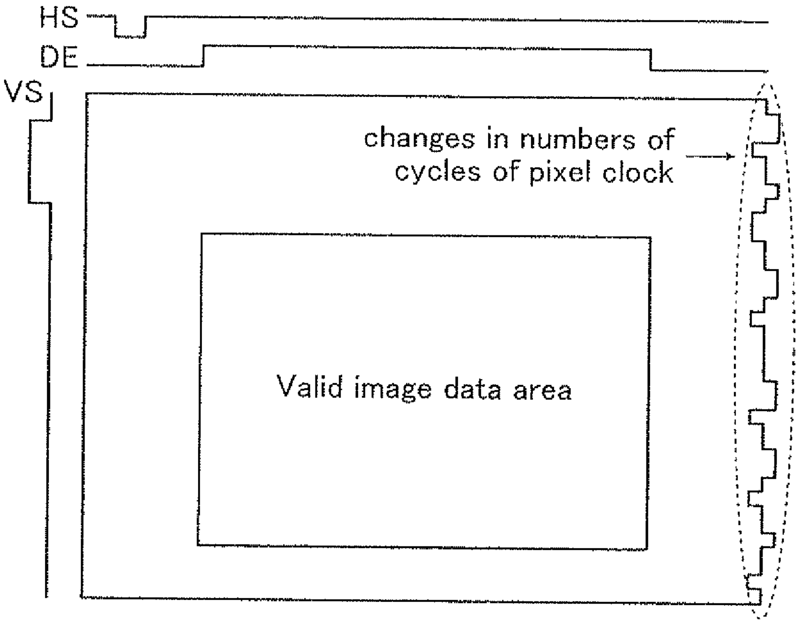
FIG. 8 Related Art
FIG. 8 is a schematic drawing that shows changes in numbers of cycles of the pixel clock signal in respective lines.

That is, as shown in FIG. 8, the number of cycles of pixel clock per line changes from a line to another. FIG. 8 schematically shows a valid image data area where an image is displayed and also shows periods that each of the horizontal synchronizing signal HS, the vertical synchronizing signal VS, and a data valid signal DE is generated. The data valid signal DE is a signal synchronized with the output clock signal, and becomes valid, or 'H' level in the example shown if FIG. 8, when data in the valid image data area is output. The steps shown on the right side of FIG. 8 represent the situation that the number of pixel clock per line changes from a line to another.

Now, an exemplary display control apparatus according to this disclosure will be explained.

Figure 1:
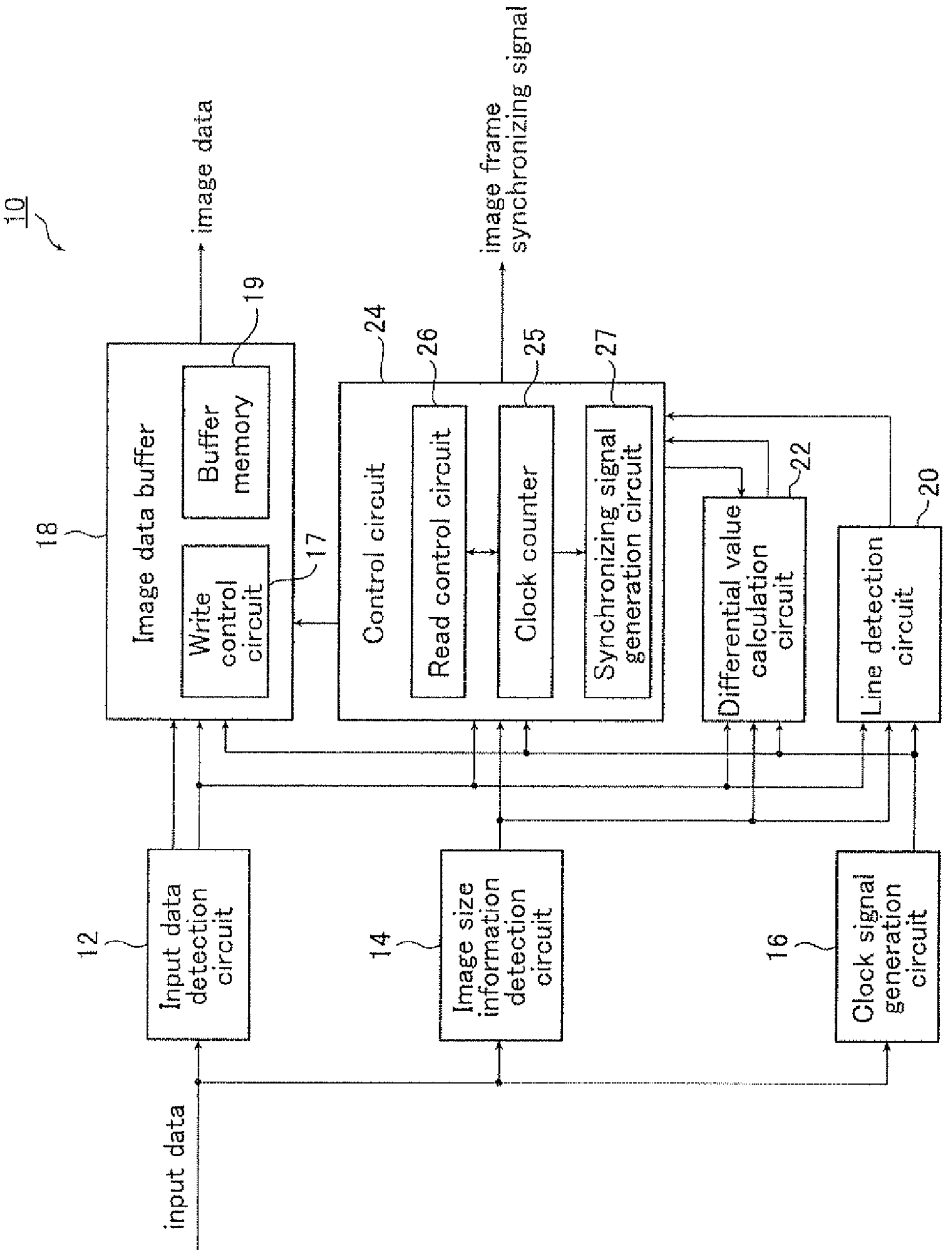
FIG. 1 is a block diagram that shows a construction of an exemplary display control apparatus according to this disclosure.

FIG. 1 is a block diagram showing a construction of an exemplary display control apparatus according to an exemplary embodiment of this disclosure. The exemplary display control apparatus 10 receives input data, which is transmitted from an image source and input to the display control apparatus, in synchronous with an input clock signal (the first clock signal). The display control apparatus 10 further outputs output data, which includes image data included in the input data, synchronizing signals, and the like, in synchronous with an output clock signal (the second clock signal) to an image display apparatus.

The image (picture) to be displayed on the image display apparatus is constituted by a plurality of frames. Each of the frames is constituted by a plurality of lines, and each of the lines is constituted by a plurality of pixels.

The input data includes pixel data, or image data of a pixel, that represents a value of each of the plurality of pixels that constitutes each of the plurality of lines that, in turn, constitutes each of the plurality of frames in the order of the frames and further in the order of the lines within the frames. The input data further includes start of horizontal blanking signal BS that indicates a start of horizontal blanking period, end of horizontal blanking signal BE that indicates an end of horizontal blanking period, and the like. A group of pixel data corresponding to a group of pixels that constitutes each of the lines is input following the input of the BE signal.

The exemplary display control apparatus 10 shown in FIG. 1 includes an input data detection circuit 12, an image size information detection circuit 14, a clock signal generation circuit 16, an image data buffer 18, a line detection circuit 20, a differential value calculation circuit 22, and a control circuit 24. The control circuit 24 includes a clock counter (pixel counter) 25 that counts cycles of the output clock signal. The input data detection circuit 12 detects, from the input data input from the image source, the start of horizontal blanking signal BS, the end of horizontal blanking signal BE, and the like.

When the clock signal is input from a clock signal line provided separately from signal lines from which the pixel data is input, the clock signal may be used, as it is, as the input clock signal in the display control apparatus 10. When the separate clock signal is not provided, a clock signal corresponding to the input pixel data may be recovered from the pixel data included in the input data, and may be used as the input clock signal.

The image size information detection circuit 14 receives image size information data, which is included in the input data and is input during a vertical blanking period, and detects image size information including, for example, a number of horizontal pixels, or a number of pixels per line, and a number of lines per frame. The image size information may further include a number of horizontal pixels and a number of lines in a valid image data area, and a position of the valid image data area within the frame, and the like.

The clock signal generation circuit 16 generates output clock signal (pixel clock signal) from the input data. That is, the clock signal generation circuit 16 generates the output clock signal based on the input clock signal and the values M and N input during the vertical blanking period.

The image data buffer 18 temporally stores the image data input from the input data detection circuit 12 and absorb a timing difference between the input side and the output side. The image data buffer 18 includes, in addition to a buffer memory 19, write control circuit 17 that controls writing of the pixel data into the buffer memory 19. The write control circuit 17 operates based on the input clock signal received from the clock generation circuit 16 and a notification of detection of the BE signal received from the input data detection circuit 12, and supplies write command signal to the buffer memory 19 based on a timing of the BE signal.

The buffer memory 19 supplied with the write command signal writes the pixel data therein in synchronous with the input clock signal. The write command signal is supplied during a number of cycles of the input clock signal necessary to write a group of pixel data corresponding to the number of horizontal pixels in the valid image data area. The number of cycles of the input clock signal necessary to write the group of pixel data is not necessarily equal to the number of horizontal pixels, because a plurality of cycles of the input clock signal may be used to write individual pixel data corresponding to a pixel.

The buffer memory 19 of the image data buffer 18 according to an exemplary embodiment of this disclosure has a memory capacity insufficient to store a group of pixel data corresponding to a number of pixels constituting each of the lines. The image data stored in the buffer memory 19 is read and output in synchronous with the output clock signal supplied from the clock signal generation circuit 16 when the image data buffer 18 is supplied with a read command signal from the read control circuit 26.

The line detection circuit 20 operates based on the input clock signal received from the clock signal generation circuit 16, the image size information received from the image size information detection circuit 14, and notifications of the BS signal and the BE signal from the input data detection circuit 12. Specifically, the line detection circuit 20 detects the first line in the vertical blanking period and outputs a detect information thereof.

The differential value calculation circuit 22 operates based on the output clock signal received from the clock signal generation circuit 16, notification of the BE signal received from the input data detection circuit 12, the image size information received from the image size information detection circuit 14, and a count value received from the clock counter 25. The differential value calculation circuit 22 calculates a difference of the count value of the clock counter 25 from an expected value thereof within each frame at a timing of, for example, the BE signal in the last line within the valid image data area.

The control circuit 24 operates based on the output clock signal received from the clock signal generation circuit 16, notification of the BE signal detection received from the input data detection circuit 12, the image size information received from the image size information detection circuit 14, detection information of the first line in the vertical blanking period received from the line detection circuit 20, and the differential value received from the differential value calculation circuit 22.

Specifically, the control circuit 24 controls reading of the pixel data from the image data buffer 18. The control circuit 24 further generates image frame synchronizing signals including horizontal address signal, horizontal synchronizing signal HS, vertical synchronizing signal VS, data valid signal DE, and the like. The control circuit 24 further includes read control circuit 26 that generates a read command signal that commands the buffer memory 19 of the image data buffer 18 to read the pixel data, and a synchronizing signal generation circuit 27 that generates the image frame synchronizing signals.

According to an exemplary embodiment of this disclosure, the clock counter 25 is initialized at a timing of the BE signal in the first line within the valid image data area in the first frame to an initial count value of, for example, 0. Then, the clock counter 25 counts the number of cycles of the output clock signal, and is initialized to the initial value when it reaches a final count value of, for example, n. Thereafter, the counter repeats counting and being initialized in the same way.

The read control circuit 26 assigns a period of a specified number of cycles of the output clock signal to each of the lines in the order of the lines within each of the frames based on the count value of the clock counter 25, which repeats the count values between the initial value and the final value. And the read control circuit 26 commands the buffer memory 19, within the period assigned to each of the lines, to read and output a group of pixel data corresponding to a group of pixels that constitutes a line in the valid image data area when the count value of the clock counter 25 is within a specified range.

Furthermore, the read control circuit 25 performs a timing adjustment in each of the second and following frames, by adjusting the number of pixels in the first line within the vertical blanking period. Thereby, in the second and following frames, readings of the pixel data from the buffer memory 19 are controlled according to the adjusted timings. Thus, an accumulation of the difference, or latency, between the input and the output timings of the pixel data is prevented.

The synchronizing signal generation circuit 27 generates and outputs the vertical synchronizing signal VS, the horizontal synchronizing signal HS, and the valid data signal DE based on the count value of the clock counter 25. Specifically, the valid data signal DE is generated when the count value of the clock counter 25 is within the range that the read control circuit 26 commands the buffer memory 19 to read the pixel data in each of the lines within the valid image data area.

The horizontal synchronizing signal HS is generated, i.e., takes a valid level, e.g., 'H' level, during a period of a specified number of cycles of the output clock signal before the count value of the clock counter 25 reaches the value for commanding the buffer memory 19 to read the pixel data. The HS signal is generated in each of the lines including the lines before the valid image data area. The vertical synchronizing signal VS is generated during a period from a first timing to a second timing later than the first timing. The first timing is a timing of the HS signal in the first line that the line detection circuit 20 detected. The second timing is a timing of the HS signal in a specified line before the first line within the valid image data area.

Figure 2A:
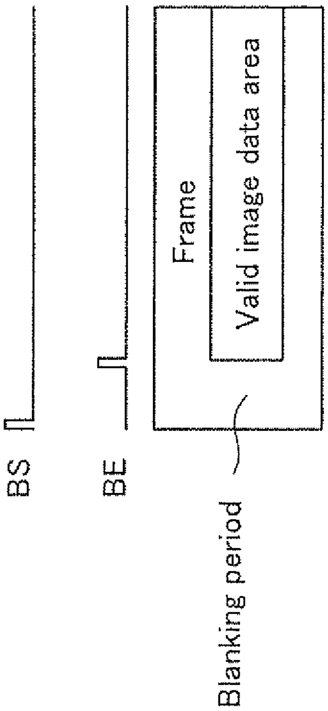
FIG. 2A is a schematic drawing that shows a valid image data area and a relationship between BS signal and BE signal.
Figure 2B:
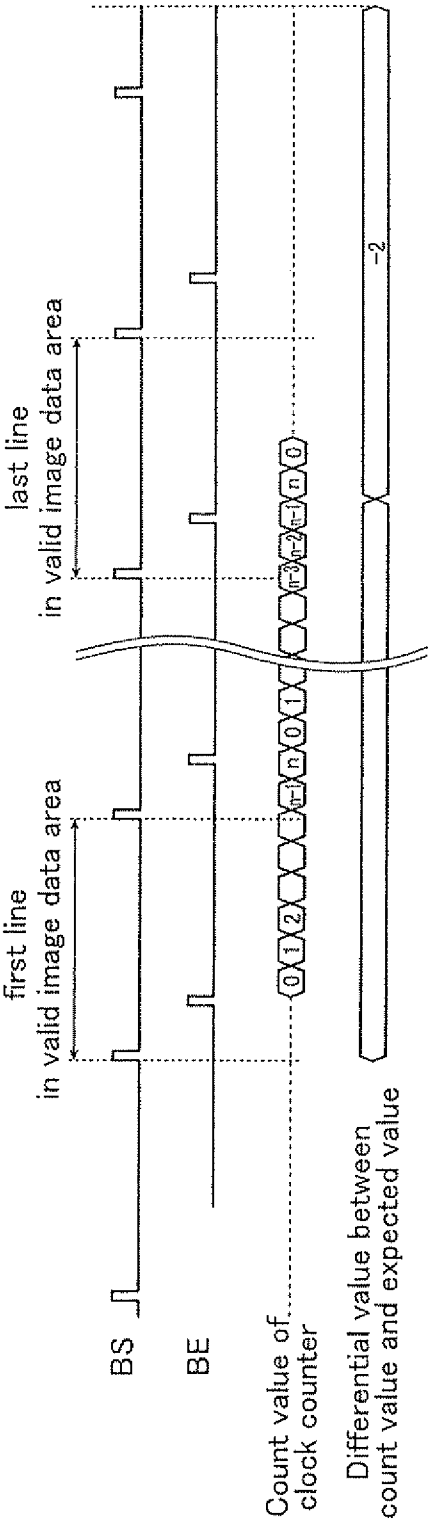
FIG. 2B is a timing chart that shows an operation of the clock counter according to an exemplary embodiment of this disclosure.

Next, calculation of the differential value in the differential value calculation circuit 22 is explained. FIG. 2A is a schematic drawing that shows a relationship between the valid image data area and the signals BS and BE. FIG. 2B is a timing chart that shows an operation of the clock counter 25. In this timing chart, it is assumed that the number of pixels in a line is n+1.

As shown in FIG. 2 A, each frame period includes a valid image data area, or an image displaying period that a valid image is displayed, and a blanking period, or an image non-displaying area that an image is not displayed. The signal BS is inserted once in each of the lines and indicates a timing of start of horizontal blanking period in each of the lines. The BE signal is inserted once in each of the lines within the valid image data area, i.e., lines that include pixels within the valid image data area. The BE signal indicates a timing of end of horizontal blanking period, or the start of valid image data area.

As shown in FIG. 2B, the counter 25 is initialized to an initial value (e.g., 0) at the timing of the BE signal in the first line in the first frame, and repeats the count values between, for example, 0 and n. The differential value calculating circuit 22 calculates a differential value between the count value of the clock counter 25 at the timing of the BE signal in the last line within the valid image data area in each of the frames and the expected value thereof, and latches the calculated value.

In each of the frames, the count value of clock counter 25 reaches the initial value of, for example, 0, after counting until the timing of the BE signal in the last line within the valid image data area when the difference (or latency) between input and output timings of the pixel data does not change within the frame. On the other hand, when the latency changes within the frame, the count value reaches a value corresponding to the change of the latency. In the example shown in FIG. 2B, the count value reaches to n−1.

The differential value calculation circuit 22 calculates a differential value by calculating a difference between the count value of the clock counter 25 at the timing of the BE signal in the last line within the valid image data area and an expected value thereof. In the example shown in FIG. 2B, the differential value between the count value=n−1 and the expected value thereof=0 (=n+1) is (n−1)−(n+1)=−2.

The count value of the clock counter 25 at the timing of the BE signal in the last line is a count value counted from the timing of the BE signal in the first line within the valid image data area to the timing of the BE signal in the last line in the valid image data area. That is, the count value at the timing of the BE signal in the last line is a count value after counting the output clock signal during a period of m−1 lines if the valid image data area has m lines.

The BE signal is synchronized with the input clock signal. Accordingly, the count value represents the number of cycles of the output clock signal during a specified number of cycles of the input clock signal. Specifically, the count value represents the number of cycles of the output clock signal during a number of cycles of the input clock signal corresponding to the number of pixels in m−1 lines.

Note that, however, the count value does not represent the total number of the cycles of the output clock signal but a value that is repeatedly counted and initialized when the count value reaches the final value of n. Accordingly, the expected value is 0, which enables easy calculation of the differential value.

FIG. 2B, shows the count value of the clock counter 25 until the count value is initialized to 0 in the last line. In fact, however, the clock counter 25 further continues to count the output clock signal and repeats the count values between 0 and n. In the next frame, the count value is corrected during the blanking period before the valid image data area based on the differential value and further repeats the values between 0 and n. In the next and following frames, the differential value calculation circuit continues to calculate the differential values between the count values at the timings of the BE signal in the last line within the valid image data area and the expected value thereof.

Figure 3:
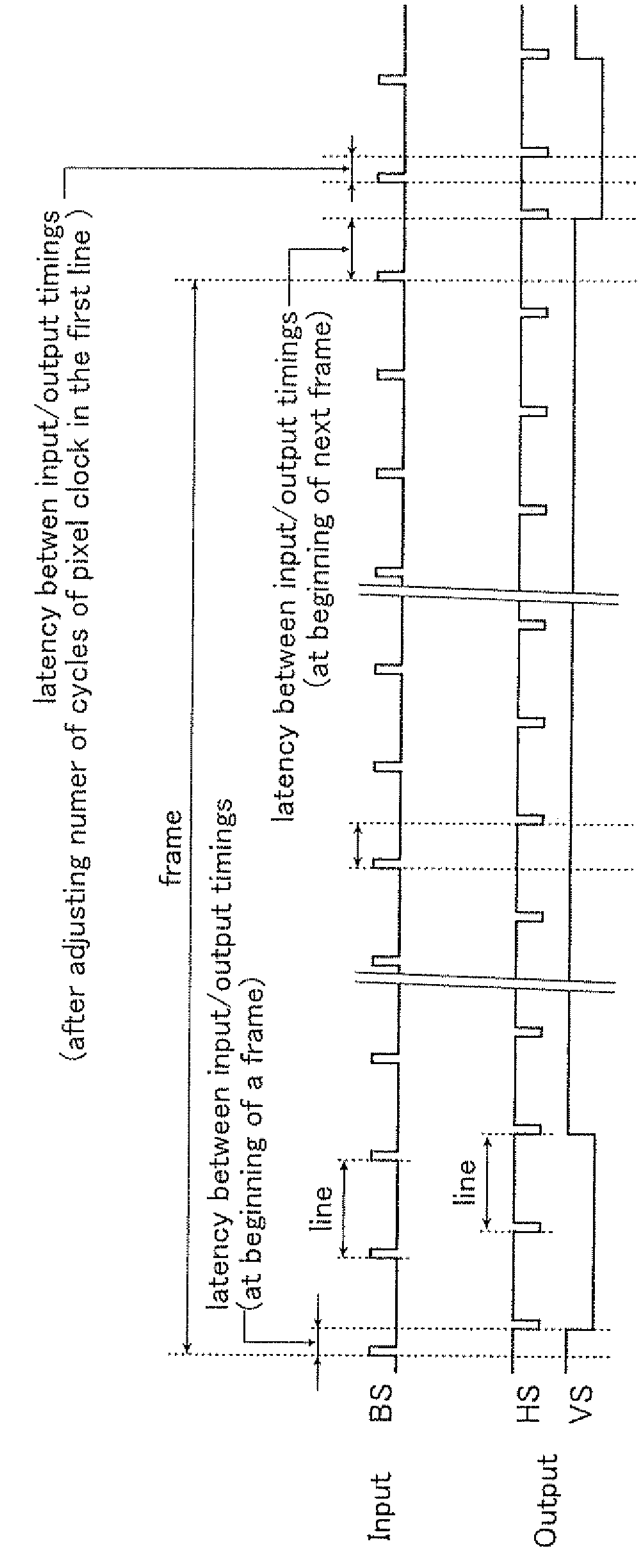
FIG. 3 is a timing chart that shows a correction of the timing difference between the start of horizontal blanking signal BS and the horizontal synchronizing signal HS according to an exemplary embodiment of this disclosure.

Next, timing correction by the read control circuit 26 will be explained. FIG. 3 is a timing chart that shows a correction of timing difference between the start of horizontal blanking signal BS and the horizontal synchronizing signal HS. That is, in FIG. 3, the correction of the timing difference is added to the timing chart shown in FIG. 6.

In the exemplary timing chart shown in FIG. 3, compared with a timing difference between the signals BS and HS at a beginning of a frame, or, more specifically, at a timing of the falling edge of the VS signal, the timing difference at the beginning of the next frame increases.

Accordingly, the read control circuit 26 corrects the change of the timing difference by performing an adjustment in the next frame based on the differential value that the differential value calculation circuit calculated in the previous frame. Specifically, the read control circuit 26 adjusts one of (1) the count value at which the clock counter 25 is initialized, or the maximum count value, and (2) the initial value, or the minimum count value, in the first line in the next frame within the vertical blanking period The count value at which the counter 25 is initialized corresponds to the count value of n, and the initial value of the clock counter 25 corresponds to the count value of 0 described in previous paragraphs. The read control circuit 26 adjusts, for example, the initial value of 0 to (0−differential value) based on the differential value.

In the example shown in FIG. 3, the adjustment describe above corrects the difference (or the latency) between the timings of the BS signal and the HIS signal, or the difference (or the latency) between the input and the output timings of the pixel data, at the beginning of the next frame. Specifically, the correction adjusts the number of cycles of the pixel clock in the first line in the blanking period of the next frame such that the difference at the beginning of the next frame becomes approximately the same as the difference at the beginning of the previous frame.

In the example shown in FIG. 3, the timing of the HS signal in the second line of the subsequent frame is advanced and the difference (or the latency) between the timings of the BS signal and the HS signal becomes approximately the same as the difference at the beginning of the previous frame. The correction is similarly performed in each of the following frames.

The differential value calculated by the exemplary differential value calculation circuit 22 does not represent the exact amount of change in the latency in a frame. According to the exemplary embodiment of this disclosure, in the first frame, the differential value calculation circuit 22 calculates a differential value that represents the amount of change in the latency during (the number of lines within the valid image data area−1) lines. In the second and following frames, the differential value calculation circuit 22 calculates differential values that represent the amounts of change in the latency during (the number of lines within the blanking period before the valid image data area+the number of lines within the valid image data area−2) lines.

In either case, the absolute value of the differential value that represents the change in the latency during an entire frame is considered to be larger than the absolute value of the differential value that the differential value calculation circuit calculated. Accordingly, at least in the second and the following frames, it is possible to correct the differential value by considering the number of lines in the entire frame and the number of lines in the valid data area, and to correct the timing by using the corrected differential value.

Figure 4:
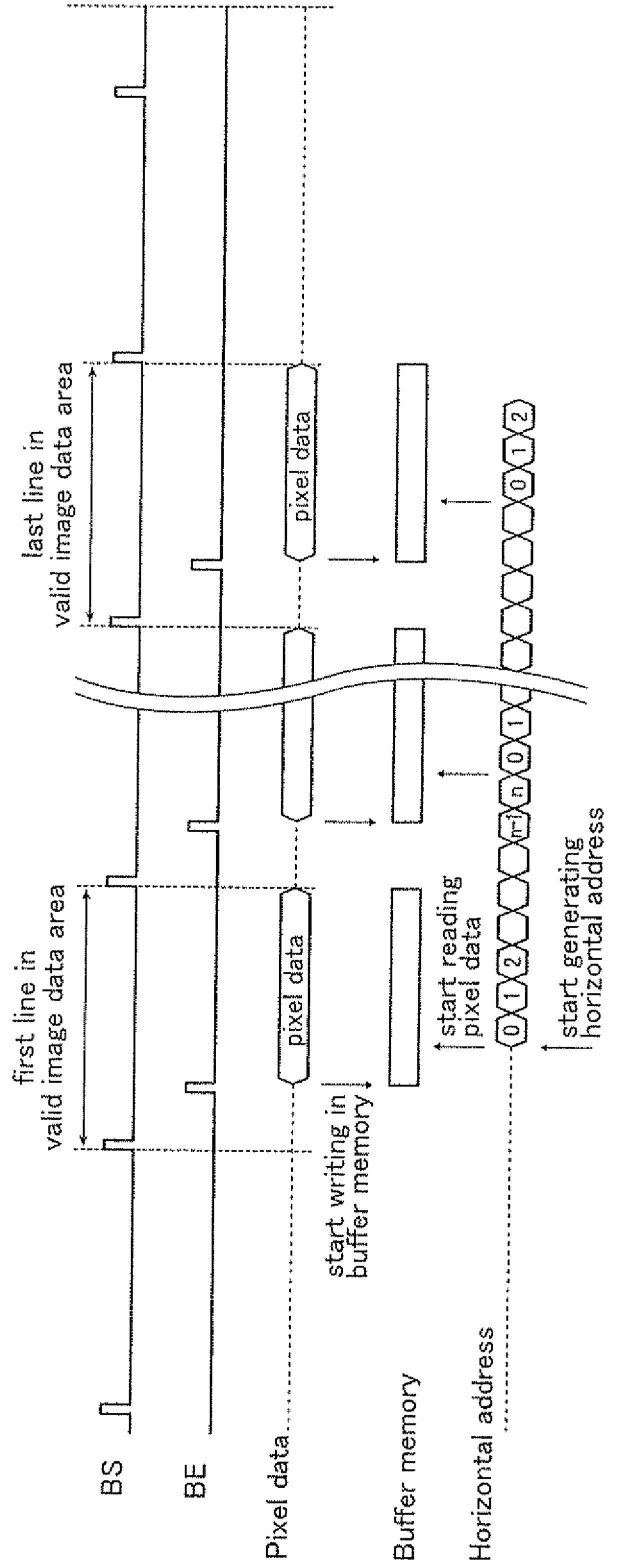
FIG. 4 is a timing chart that shows write and read timings of image data in each of the lines within the valid image data area according to an exemplary embodiment of this disclosure.

Next, the control of reading of pixel data performed by the read control circuit 26 will be explained. FIG. 4 is an exemplary timing chart that shows timings of writing and reading the pixel data in each of the lines within the valid image data area. In this exemplary embodiment, the pixel data is read from the buffer memory 19 based on the count value of 0 to n, for example, of the clock counter 25. In FIG. 4, number of cycles of the pixel clock in a line is assumed to be n+1.

As shown in FIG. 4, the pixel data is input after the BE signal in each of the lines within the valid image data area. Writing of the pixel data in the buffer memory 19 starts at the timing of the BE signal and continues successively in synchronous with the input clock signal. On the other hand, reading and outputting of the pixel data from the buffer memory 19 is performed when the count value of the clock counter 25 is within a specified range, as follows.

Firstly, reading of the pixel data in the first line within the valid image data area in the first frame starts when a specified amount of pixel data is stored in the buffer memory 19. The specified amount is determined before starting to read the pixel data in the first line within the valid image data such that the buffer memory does not over flow, i.e., dose not fall into a situation that data is written in a memory area in which data that has not yet been read is stored, and does not underflow, i.e., does not fall into a situation that all the stored data has been read. More specifically, the specified value may be preferably determined so that the buffer memory does not overflow and does not underflow even when the latency between the timings of writing and reading pixel data increases to a maximum probable amount within a frame.

In a specific example, the read control circuit 26 generates a read command signal that commands the buffer memory 19 to read data when the count value of the clock counter 25 reaches a specified value corresponding to a number of output clock cycles necessary to store a specified amount of pixel data in the buffer memory 19. Thereafter, a group of pixel data corresponding to a specified number of pixels included within the valid image data area in a line is read successively in synchronous with the output clock signal. Simultaneously with the start of reading the pixel data, the synchronizing signal generation circuit 27 starts generating the horizontal address signal that indicates the horizontal positions of the pixels.

After the completion of reading the group of pixel data in the first line within the valid image data area and the completion of generating the last horizontal address signal in the first line, the count value of the clock counter 25 returns to an initial value. After the clock counter further continues to count the pixel clock, the count value reaches to the specified value at which the reading of the pixel data started in the first line. Then, commanding the read of pixel data in the second line and generating the horizontal address signals start again. The procedure is the same for the third and following lines. Accordingly, a group of pixel data corresponding to the specified number of pixels within the valid image data area is read and output in each of the lines, and the horizontal address signal periodically changes.

In the second frame, the read control circuit 26 corrects the timing in the first line within the vertical blanking period. Thereafter, in the first line within the valid image data area, reading of the pixel data and generating of the horizontal address signal start at the same specified count value as the reading of the pixel data in the first line within the valid image data area in the first frame. The procedure is the same for the third and following frames.

Next, an operation of the display control apparatus 10 will be explained. When the input data is input from the image source, the image data detection circuit 12 detects the signals such as BS and BE, and the like, and the image size information detection circuit 14 detects the image size information. Further, the clock signal generation circuit 16 generates the output clock signal based on the input clock signal and the values M and N.

The write control circuit 17 successively writes the pixel data in the buffer memory 19 in synchronous with the input clock signal from the timing of the BE signal in each line. Further, the line detection circuit 20 detects, based on the notification of detection of the signals BS and BE and the image size information, the first line within the vertical blanking period. The differential value calculation circuit 22 calculates a differential value that represents the amount of change of the difference between the input and output timings of the pixel data within a frame.

Furthermore, the control circuit 24 commands the read of the pixel data from the image data buffer 18 and generates image frame synchronizing signals such as HS, VS, and DE signals and the horizontal address signal. These image data and the image frame synchronizing signal are supplied to the image display apparatus as the output data.

That is, the read control circuit 26 within the control circuit 24 assigns, in the first frame, a period of a specified number of cycles of the output clock signal for each of the lines in the order of the lines from respective read start timings set based on the timing of the BE signal in the first line within the valid image data area. The read control circuit 26 further commands the buffer memory 19 to successively read and output a group of pixel data corresponding to the specified number of pixels in synchronous with the output clock signal within each of the assigned period.

Specifically, the read control circuit 26 commands the buffer memory 19 to read the pixel data based on the count value of the clock counter 25. The clock counter 25 counts the output clock signal and repeats the count values between 0 and n. The read control circuit 26 assigns a period of a specified number, which may be n+1, of cycles of the output clock signal for each of the lines in the order of the lines, and commands the buffer memory 19 to output a group of pixel data corresponding to the specified number, which is the number of pixels per line within the valid image data area, of pixels within each of the assigned period based on the count value of the clock counter 25.

The synchronizing signal generation circuit 27 successively generates, based on the count value of the clock counter 25, horizontal address signal that represent the horizontal positions of the pixels in synchronous with the output clock signal from the same timing as the start of reading the pixel data. The synchronizing signal generation circuit 27 further generates other image frame synchronizing signals based on the count value of the clock counter 25.

Figure 5:
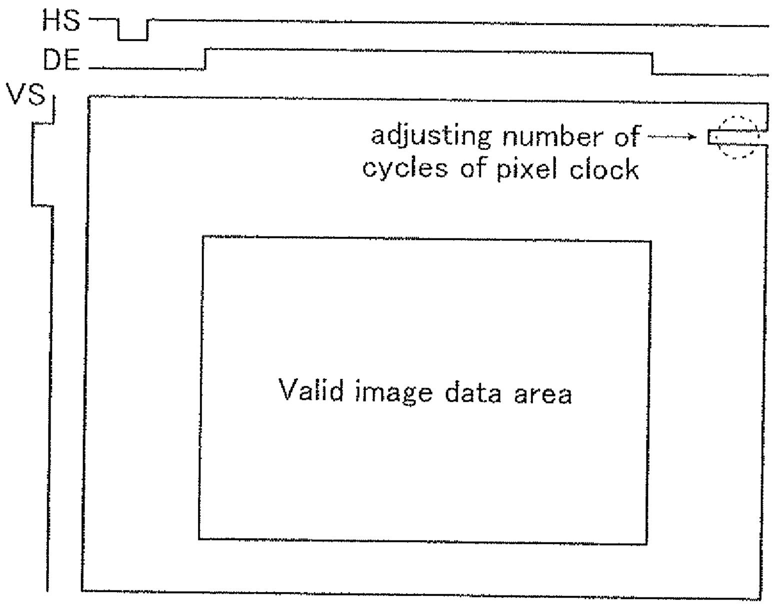
FIG. 5 is a schematic drawing that shows a concept of adjusting the number of cycles of pixel clock signal in a line according to an exemplary embodiment of this disclosure.

Further, in the second and following frames, the read control circuit 26 performs timing correction in the first line within the vertical blanking period based on the differential value that the differential value calculation circuit 22 calculated in the previous frame as shown in FIG. 5. For example, when the differential value calculated within the previous frame is minus, as the example shown in FIG. 2, the read control circuit 26 performs the correction by decreasing the number of cycles of the pixel clock in the first line. FIG. 5 shows that the number of cycles of the pixel clock is adjusted in the first line within the vertical blanking period in order to correct the change of the timing difference during a frame.

The timing correction described above is performed by adjusting the number of pixel clocks in the first line within the vertical blanking period so that the difference between the input and output timings of the pixel data becomes about the same as the difference at the beginning of the previous frame. The timing correction may be performed by, for example, adjusting the count value of the clock counter 25 at which the clock counter 25 is initialized or the initial value.

As shown in FIG. 3, the correction corrects the difference (latency) between the timings of the input and output sides in the first line within the vertical blanking period of the next frame, even if the latency changes within a frame. Thereby, the latency at the next line becomes approximately the same as the latency at the same line in the previous frame. Accordingly, the accumulation of the change of the latency within the successive frames is prevented. As a result, the overflow and the underflow of the buffer memory 19 is prevented even if the memory capacity of the buffer memory 19 is decreased.

Thereafter, the read control circuit 26 continues to assign the period of the specified number of cycles of the output clock signal for each of the lines in the order of the lines, and commands the buffer memory 19 to successively read and output a group of pixel data corresponding to the specified number of pixels in synchronous with the output clock signal within each of the assigned periods. The synchronizing signal generation circuit 27 successively generates and outputs the horizontal address signals in synchronous with the output clock signal from the same timings as the start of reading the pixel data.

In the exemplary embodiment described above, the change of the timing difference (latency) between the input and output sides in the previous frame is corrected in the first line within the vertical blanking period, without changing the number of pixel clocks in each of the lines. Accordingly, accumulation of the change of difference (latency) between the input and output timings of the pixel data is prevented without affecting the actually displayed image.

According to the specification of DisplayPort, the source supplies the synchronizing signal in a packet. Therefore, intervals between timings of receiving BE signals may be uneven. Accordingly, in the exemplary embodiment, the amount of change of the latency calculated based on the difference between the count value of the clock counter during a period between different BE signals and the expected value thereof may include an error.

In practice, however, timings of transmitting packets are adjusted so that intervals between BE signals are kept effectively the same. Specifically, the timings are adjusted such that the variation of the intervals is kept within a few cycles of the transmission clock signal, or the input clock signal. Accordingly, in practice, the exemplary embodiment described above enables to evaluate the change of the latency between the input and output timings of the pixel data and to perform the correction. Thereby, accumulation of the change of the latency may be prevented.

According to the exemplary embodiment described above, initialization of the clock counter 25 at the timing of BE signal is performed only in the first line within the valid image data area in the first frame. In the second and following frames, the correction based on the differential value calculated in the previous frame is performed in the first line within the vertical blanking period, and the clock counter 25 repeats the count value between the initial value and the specified value.

It might be also possible to initialize the clock counter 25 at the timing of the BE signal in the first line within the valid image data area in each of the frames. Thereby, accumulation of the change of the difference, or the latency, between the input and output timings may be prevented. In this case, however, number of cycles of the pixel clock in the first line within the valid image data area may be changed in each frame, and the displayed image may be disturbed.

The exemplary embodiment described above performs the timing correction within the vertical blanking period. Accordingly, number cycles of the pixel clock per line can be kept constant within the valid image data area, and the displayed image would not be disturbed.

In the exemplary display control apparatus described above, the memory capacity of the buffer memory 19 is set to be less than the capacity capable of storing a group of pixel data corresponding to a number of pixels of image data that constitute a line. It is not necessary but preferable to reduce the memory capacity of the buffer memory in order to reduce the const of the display control apparatus. Accordingly, the memory capacity of the buffer memory may be adjusted considering the maximum difference between the input and output timings of the image data.

In the exemplary display control apparatus described above, the differential value calculation circuit 22 calculates the differential value at a timing of the BE signal in the last line within the valid image data area in each frame. However, the differential value calculation circuit may calculate the differential value based on the count value of the clock counter 25 at the timing of the BE signal in an arbitrary line after the first line within the valid image data area in each of the frames. That is, the differential value calculation circuit may calculate a differential value that represents a difference between a number of cycles of the output clock signal within a period of an arbitrarily specified number of cycles of the input clock signal and an expected number thereof.

In the exemplary display control apparatus described above, the read control circuit 26 corrects the change of the difference between the timings of the input and output sides by adjusting the number of cycles of the pixel clock in the first line within the vertical blanking period. However, the read control circuit may also adjust numbers of cycles of the pixel clock in one or more of the lines within the vertical blanking period. In other words, the read control circuit may correct the timing before the BE signal in the first line within the valid image data area.

Needless to say, various exemplary display control apparatuses described above may accept various improvements and modifications.

What is claimed is:

1. An apparatus for controlling display device, comprising:

an image data buffer including a buffer memory, the image data buffer receiving input data including a plurality of groups of pixel data each representing values of a group of pixels that constitutes each of a plurality of lines that, in turn, constitutes each of a plurality of frames, in an order of the frames and further in an order of the lines in each of the frames, and writing the groups of pixel data in the buffer memory in synchronous with a first clock signal, wherein the input data further includes end of horizontal blanking signals that indicate ends of horizontal blanking periods in respective ones of the lines such that each of the groups of pixel data is received after the end of horizontal blanking signal in a corresponding one of the lines;

a differential value calculation circuit that calculates, in each of the plurality of frames, a differential value between a number of cycles of a second clock signal during a period of a specified number of cycles of the first clock signal and an expected value thereof: and a read control circuit, that:

assigns, in a first one of the frames, a period of a specified number of cycles of the second clock signal for each of the lines from a read start timing determined based on a timing of the end of horizontal blanking signal in a first one of the lines in the order of the lines;

performs, in each of a second and following ones of the frames, a timing correction before the end of horizontal blanking signal in the first one of the lines based on the differential value that the differential value calculation circuit calculated in a previous frame, and subsequently assigns a period of the specified number of cycles of the second clock signal for each of the lines from a corrected read start timing in the order of the lines; and commands, in each of the first and following ones of the frames, the buffer memory to read and output to the display device, in each of the assigned periods, corresponding one of the groups of pixel data in synchronous with the second clock signal, wherein the differential value is corrected, based upon both a number of lines in the entire respective frame and a number of lines in a valid data area, to reflect an amount of change in latency in the respective frame for which the differential value is calculated.

2. The apparatus according to claim 1, wherein the second clock signal is asynchronous with the first clock signal.

3. The apparatus according to claim 1, wherein:

the read control circuit includes a clock counter that is initialized to an initial value at the timing of the end of horizontal blanking signal in the first one of the lines in the first one of the frames and then repeats counting cycles of the second clock signal and being initialized to the initial value when a count value of the clock counter reaches a specified count value; and the read control circuit assigns the period of the specified number of cycles of the second clock signal for each of the lines based on the count value of the clock counter, and performs the timing correction by adjusting one of the specified count value and the initial value.

4. The apparatus according to claim 3, wherein:

the differential value calculation circuit calculates the differential value based on the count value of the clock counter at a timing of the end of horizontal blanking signal in one of the lines after the first one of the lines.

5. The apparatus according to claim 3, wherein:

the read control circuit commands the buffer memory to read and output the corresponding one of the groups of pixel data when the count value of the clock counter is within a specified range.

6. The apparatus according to claim 1, wherein the buffer memory has a memory capacity insufficient to store each of the groups of pixel data.

7. An apparatus for controlling display device, comprising:

an image data buffer including a buffer memory, the image data buffer receiving input data including a plurality of groups of pixel data each representing values of a group of pixels that constitutes each of a plurality of lines that, in turn, constitutes each of a plurality of frames, in an order of the frames and further in an order of the lines in each of the frames, and writing the groups of pixel data in the buffer memory in synchronous with a first clock signal, wherein the input data further includes end of horizontal blanking signals that indicate ends of horizontal blanking periods in respective ones of the lines such that each of the groups of pixel data is received after the end of horizontal blanking signal in a corresponding one of the lines;

a read control circuit including a clock counter that is initialized to an initial value at a timing of the end of horizontal blanking signal in a first one of the lines in a first one of the frames and then repeats counting cycles of a second clock signal and being initialized to the initial value when a count value of the clock counter reaches a specified count value; and a differential value calculation circuit that calculates, in each of the plurality of frames, a differential value between the count value of the clock counter at a timing of the end of horizontal blanking signal in one of the lines after the first one of the lines and an expected value thereof;

wherein the read control circuit:

assigns, in the first one of the frames, a period of a specified number of cycles of the second clock signal for each of the lines based on the count value of the clock counter in the order of the lines;

performs, in each of a second and following ones of the frames, a timing correction before the end of horizontal blanking signal in the first one of the lines by adjusting one of the specified count value and the initial value based on the differential value that the differential value calculation circuit calculated in a previous frame, and subsequently assigns a period of the specified number of cycles of the second clock signal for each of the lines based on the count value of the clock counter in the order of the lines; and commands, in each of the first and following ones of the frames, the buffer memory to read and output to the display device, in each of the assigned periods, corresponding one of the groups of pixel data in synchronous with the second clock signal, and wherein the differential value is corrected, based upon both a number of lines in the entire respective frame and a number of lines in a valid data area, to reflect an amount of change in latency in the respective frame for which the differential value is calculated.

8. The apparatus according to claim 7, wherein the second clock signal is asynchronous with the first clock signal.

9. A method for controlling display device comprising:

receiving input data including a plurality of groups of pixel data each representing values of a group of pixels that constitutes each of a plurality of lines that, in turn, constitutes each of a plurality of frames, in an order of the frames and further in an order of the lines in each of the frames, and writing the groups of pixel data in a buffer memory in synchronous with a first clock signal, wherein the input data further includes end of horizontal blanking signals that indicate ends of horizontal blanking periods in respective ones of the lines such that each of the groups of pixel data is received after the end of horizontal blanking signal in a corresponding one of the lines;

calculating, in each of the plurality of frames, a differential value between a number of cycles of a second clock signal during a period of a specified number of cycles of the first clock signal and an expected value thereof;

assigning, in a first one of the frames, a period of a specified number of cycles of the second clock signal for each of the lines from a read start timing determined based on a timing of the end of horizontal blanking signal in a first one of the lines in the order of the lines;

performing, in each of a second and following ones of the frames, a timing correction before the end of horizontal blanking signal in the first one of the lines based on the differential value calculated in a previous frame, and subsequently assigning a period of the specified number of cycles of the second clock signal for each of the lines from a corrected read start timing in the order of the lines; and commanding, in each of the first and following ones of the frames, the buffer memory to read and output to the display device, in each of the assigned periods, corresponding one of the groups of pixel data in synchronous with the second clock signal, wherein the differential value is corrected, based upon both a number of lines in the entire respective frame and a number of lines in a valid data area, to reflect an amount of change in latency in the respective frame for which the differential value is calculated.

10. The method according to claim 9, wherein the second clock signal is asynchronous with the first clock signal.

11. The method according to claim 9, further comprising counting cycles of the second clock signal using a clock counter, wherein:

the counting includes initializing the clock counter to an initial value at the timing of the end of horizontal blanking signal in the first one of the lines in the first one of the frames and then repeatedly counting the cycles of the second clock signal and being initialized to the initial value when a count value of the clock counter reaches a specified count value;

the assigning in each of the first and following one of the frames includes assigning the period of the specified number of cycles of the second clock signal for each of the lines based on the count value of the clock counter; and the timing correction is performed by adjusting one of the specified count value and the initial value.

12. The method according to claim 11, wherein:

the differential value is calculated based on the count value of the clock counter at a timing of the end of horizontal blanking signal in one of the lines after the first one of the lines.

13. The method according to claim 11, wherein:

the commanding is performed such that the corresponding one of the groups of pixel data is read and output when the count value of the clock counter is within a specified range.

14. The method according to claim 9, wherein the buffer memory has a memory capacity insufficient to store each of the groups of pixel data.

15. A method for controlling display device comprising:

receiving input data including a plurality of groups of pixel data each representing values a group of pixels that constitutes each of a plurality of lines that, in turn, constitutes each of a plurality of frames, in an order of the frames and further in an order of the lines in each of the frames, and writing the groups of pixel data in a buffer memory in synchronous with a first clock signal, wherein the input data further includes end of horizontal blanking signals that indicate ends of horizontal blanking periods in respective ones of the lines such that each of the groups of pixel data is received after the end of horizontal blanking signal in a corresponding one of the lines;

counting cycles of a second clock signal using a clock counter, the counting including initializing the clock counter to an initial value at a timing of the end of horizontal blanking signal in a first one of the lines in a first one of the frames and then repeatedly counting the cycles of the second clock signal and being initialized to the initial value when a count value of the clock counter reaches a specified count value;

calculating, in each of the plurality of frames, a differential value between the count value of the clock counter at a timing of the end of horizontal blanking signal in one of the lines after the first one of the lines and an expected value thereof;

assigning, in the first one of the frames, a period of a specified number of cycles of the second clock signal for each of the lines based on the count value of the clock counter in the order of the lines;

performing, in each of a second and following ones of the frames, a timing correction before the end of horizontal blanking signal in the first one of the lines by adjusting one of the specified count value and the initial value based on the differential value calculated in a previous frame, and subsequently assigning a period of the specified number of cycles of the second clock signal for each of the lines based on the count value of the clock counter in the order of the lines, and commanding, in each of the first and following ones of the frames, the buffer memory to read and output to the display device, in each of the assigned periods, corresponding one of the groups of pixel data in synchronous with the second clock signal, wherein the differential value is corrected, based upon both a number of lines in the entire respective frame and a number of lines in a valid data area, to reflect an amount of change in latency in the respective frame for which the differential value is calculated.

16. The method according to claim 15, wherein the second clock signal is asynchronous with the first clock signal.

* * * * *